US005635320A

United States Patent [19]

Ohtake et al.

[11] Patent Number: 5,635,320

[45] Date of Patent: Jun. 3, 1997

[54] COLOR CATHODE RAY TUBE AND METHOD MANUFACTURING THE SAME

[75] Inventors: Yasuhisa Ohtake; Seiji Sago, both of Fukaya; Nobuo Kita, Himeji, all of Japan

[73] Assignee: Kabushiki Kaisha Toshiba, Kawasaki, Japan

[21] Appl. No.: 375,949

[22] Filed: Jan. 20, 1995

Related U.S. Application Data

[62] Division of Ser. No. 293,968, Aug. 24, 1994, abandoned.

[30] Foreign Application Priority Data

Aug. 25, 1993 [JP] Japan .................................... 5-210021
Aug. 25, 1993 [JP] Japan .................................... 5-210024

[51] Int. Cl.$^{6}$ ........................................................ G03F 9/00

[52] U.S. Cl. ................................ 430/23; 430/4; 430/313; 313/403

[58] Field of Search .................................... 430/23, 24, 5, 430/4, 313; 313/402, 403

[56] References Cited

U.S. PATENT DOCUMENTS

| | | | |
|---|---|---|---|
| 4,662,984 | 5/1987 | Ohtake et al. | 430/23 |
| 4,861,422 | 8/1989 | Kudou et al. | 430/23 |
| 5,326,663 | 7/1994 | Tanaka et al. | 430/23 |
| 5,411,822 | 5/1995 | Ohtake et al. | 430/23 |

FOREIGN PATENT DOCUMENTS

| | | |
|---|---|---|
| 477670 | 3/1972 | Japan . |
| 50-142160 | 11/1975 | Japan . |
| 53-105363 | 9/1978 | Japan . |
| 5757449 | 9/1978 | Japan . |
| 61-114440 | 6/1986 | Japan . |
| 61-114439 | 6/1986 | Japan . |
| 487235 | 3/1992 | Japan . |

*Primary Examiner*—John S. Chu
*Attorney, Agent, or Firm*—Cushman Darby & Cushman IP Group; IP Group of Pillsbury Madison & Sutro, LLP

[57] ABSTRACT

A shadow mask of a color cathode ray tube has a large number of electron beam apertures through which electron beams emitted from the electron gun pass. Bach of the electron beam apertures has a larger opening open to a surface of the shadow mask on a phosphor screen side, and a smaller opening open to a surface of the shadow mask on an electron gun side and communicating with the larger opening. The smaller opening of each of the electron beam apertures located at a peripheral portion of the shadow mask is defined by a wall surface of the shadow mask. The wall surface includes an outward portion which is located outward in a radial direction with respect to a center of the shadow mask and a central-side portion which is located on a central side of the shadow mask. An angle defined by the outward portion and a central axis of the smaller opening is larger than an angle defined by the central-side portion and the central axis of the smaller opening.

21 Claims, 7 Drawing Sheets

COLOR CATHODE RAY TUBE AND METHOD MANUFACTURING THE SAME

This is a division of application Ser. No. 08/293,968, filed Aug. 24, 1994, now abandoned.

BACKGROUND OF THE INVENTION

1. Field of the Invention

The present invention relates to a color cathode ray tube and, more particularly, to a color cathode ray tube having a shadow mask, and a method of manufacturing the same.

2. Description of the Related Art

Generally, a shadow mask type color cathode ray tube has a glass envelope constituted by a substantially rectangular faceplate, a skirt portion continuous to the faceplate, a cylindrical neck opposing the faceplate, and a funnel connecting the skirt portion and the neck. A phosphor screen on which phosphors that emit light in red, blue, and green are regularly arranged is formed on the inner surface of the faceplate. An electron gun for emitting a plurality of electron beams corresponding to red, blue, and green is disposed in the neck.

A shadow mask having a large number of regularly arranged electron beam apertures is disposed at a position closely opposing the phosphor screen at a predetermined distance. The peripheral portion of the shadow mask is bonded to a mask frame and is engaged with stud pins of the skirt portion through a mask holder. Each electron beam aperture of the shadow mask is formed such that the sectional area of an opening on the phosphor screen side (to be referred to as a larger opening hereinafter) is larger than that of an opening on the electron gun side (to be referred to as a small opening hereinafter). With this shape, a constant electron beam amount is maintained even when an electron beam is obliquely incident on the electron beam aperture at the peripheral portion of the shadow mask.

In the color cathode ray tube having the above arrangement, the shadow mask has a function of transmitting the electron beam therethrough such that the electron beam correctly lands on only the phosphor of each color which is geometrically in a one to one relationship with the electron beam aperture. This is a significant element called a color selection electrode. The electron beam apertures of the shadow mask may be circular or rectangular in shape. Usually, shadow masks having circular apertures are used in display tubes that display characters and figures at high definition. Shadow masks having rectangular apertures are mainly used in tubes used in the household, such as television tubes. For example, a rectangular electron beam aperture is formed such that its longer side extends substantially perpendicular to the shorter side (vertical axis) of a substantially rectangular faceplate. A large number of vertical aperture columns each having a plurality of vertically arranged apertures are arranged in the horizontal direction. The adjacent shorter sides of the electron beam apertures of the respective vertical aperture arrays are arranged with bridge portions therebetween, which extend substantially in parallel to the longer side (horizontal axis) of the faceplate.

The closer to the peripheral portion of the shadow mask, the larger the angle of incidence of the electron beam, i.e., the larger the angle defined by the normal to the mask or the aperture central axis and the electron beam axis, and part of the incident electron beam collides against the aperture edge or aperture wall of the aperture at a higher rate. As a result, the shape of the electron beam spot formed on the phosphor screen is distorted, thereby degrading the luminance or white uniformity.

In recent years, an image which reflects less external light and has less distortion is demanded from the viewpoint of human technology. A flat panel is inevitable to satisfy this demand. Accordingly, a flat shadow mask having a relative relationship with the phosphor screen is required. In a flattened shadow mask, the angle of incidence of the electron beam becomes inevitably large, and in particular, the angle of beam incidence at the peripheral portion of the mask increases. As a result, a distortion in the beam spot shape also becomes conspicuous.

The problem of beam spot distortion is more likely in a shadow mask made of a thick material and in a shadow mask having electron beam apertures which are arranged at small pitches so as to obtain a high resolution.

As means for preventing the beam spot distortion or beam omissions, Jpn. Pat. Appln. KOKOKU Publication No. 47-7670 and Jpn. Pat. Appln. KOKAI Publication Nos. 50-142160 and 57-57449 propose a so-called off-center mask in which the aperture center of the phosphor-screen-side larger opening of the shadow mask is deviated with respect to the aperture center of its corresponding electron-gun-side smaller opening in a direction in which the electron beam passes. With the arrangement of this off-center mask, the problem in which the incident electron beam collides against the aperture wall surface or aperture edge of the larger opening to cause a beam omission can be avoided.

However, in the off-center mask, the amount of electron beam passing through the electron beam aperture, i.e., the width of the passing electron beam is determined by the position of that portion of the end edge of the smaller opening which is located at the mask center side, and the position of that portion of the boundary between the larger and smaller openings which is located outward in the radial direction with respect to the mask center. In this case, part of the electron beam incident on the electron beam aperture is shielded by that portion of the wall surface defining the smaller opening which is located outward in the radial direction with respect to the mask center, and the width of the actual passing electron beam becomes smaller than the diameter of the smaller opening. The difference between the width of the passing electron beam and the aperture diameter of the smaller opening is increased in a flat square tube. When the position of the boundary, i.e., the distance from the end edge of the smaller opening on the shadow mask surface to the boundary is changed, the width of the passing electron beam is also changed. This causes a degradation in white uniformity in a color cathode ray tube in which the electron beam landing area on the phosphor screen has little freedom.

Furthermore, in a flat shadow mask, an electron beam collides against that portion of the wall surface defining the smaller opening which is located outward in the radial direction with respect to the mask center, and is reflected by this portion at a higher rate. This is caused by the following facts. Usually, the electron beam apertures of a shadow mask are formed by etching. Thus, the angle defined by the aperture center axis of the smaller opening and that portion of the side surface of the smaller opening which is located near the opening edge on the electron-gun-side becomes smaller than the angle defined by the aperture center axis of the smaller opening and that portion of the side surface of the smaller opening which is located near the boundary. When an offset between the smaller and larger openings is large, the boundary on the electron beam traveling side approaches the electron gun side, and the angle defined by the side surface of the smaller opening, against which the electron beam collides, and the aperture central axis is decreased. As a result, the reflected electron beam directed to the center of the phosphor screen is increased. Since this reflected electron beam is not controlled at all, it lands on a phosphor other than the predetermined phosphor to cause it to emit light, so that the black level of the entire screen is decreased, thereby largely decreasing the contrast. As a result, the contrast becomes the same as that obtained when the TV screen is observed during daylight, and the image quality is degraded.

Even when the aperture centers of the larger and smaller openings are deviated from each other by a necessary amount so that the electron beam will not collide against the aperture side surface of the electron beam aperture or the large opening end to cause beam spot distortion in this manner, occurrence of an undesired reflected electron beam, that causes degradation in contrast, cannot be avoided in a color cathode ray tube having a flattened shadow mask and a large angle of incidence of the electron beam.

SUMMARY OF THE INVENTION

The present invention has been made in view of the above problems, and its object is to provide a color cathode ray tube in which a desired electron beam passes through an electron beam aperture without causing electron beam spot distortion, and in which even when an electron beam collides against an aperture side wall, a reflected electron beam will not cause an unnecessary phosphor to emit light, and a method of manufacturing the same.

In order to achieve the above object, according to an aspect of the present invention, there is provided a color cathode ray tube comprising: a faceplate having a phosphor screen formed on an inner surface thereof; an electron gun arranged to oppose the phosphor screen, for emitting electron beams toward the phosphor screen; and a shadow mask arranged between the faceplate and the electron gun to oppose the phosphor screen. The shadow mask has a large number of electron beam apertures which are regularly arranged and through which the electron beams pass. Each of the electron beam apertures has a larger opening open to a surface of the shadow mask on the phosphor screen side, and a smaller opening open to a surface of the shadow mask on the electron gun side and communicating with the larger opening. A wall surface of the shadow mask which defines the smaller opening of each of the electron beam apertures located at a peripheral portion of the shadow mask includes an outward portion which is located outward in a radial direction with respect to a center of the shadow mask and a central-side portion which is located on a central side of the shadow mask. An angle defined by the outward portion and a central axis of the smaller opening is larger than an angle defined by the central-side portion and the central axis of the smaller opening.

According to another aspect of the present invention, there is provided a color cathode ray tube comprising: a faceplate having a phosphor screen formed on an inner surface thereof; an electron gun arranged to oppose the phosphor screen for emitting electron beams toward the phosphor screen; and a shadow mask arranged between the faceplate and the electron gun to oppose the phosphor screen. The shadow mask has a large number of electron beam apertures which are regularly arranged and through which the electron beams pass. Each of the electron beam apertures has a larger opening open to a surface of the shadow mask on a phosphor screen side, a smaller opening open to a surface of the shadow mask on an electron gun side and communicating with the larger opening, and a minimum-diameter portion defined by the boundary between the large and smaller openings. A wall surface of the shadow mask which defines the smaller opening of each of the electron beam apertures located at a peripheral portion of the shadow mask includes an outward portion which is located outward in a radial direction with respect to a center of the shadow mask and a central-side portion which is located on a central side of the shadow mask. The outward portion has a first section extending from an intermediate portion which is between an open edge of the smaller opening and the minimum-diameter portion to the open edge, and a second section extending from the intermediate portion to the minimum-diameter portion. The angle defined by the first section and a central axis of the smaller opening is larger than the angle defined by the second section and the central axis of the smaller opening.

According to still another aspect of the present invention, there is provided a color cathode ray tube comprising: a faceplate having a phosphor screen formed on an inner surface thereof; an electron gun arranged to oppose the phosphor screen for emitting electron beams toward the phosphor screen; and a shadow mask arranged between the faceplate and the electron gun to oppose the phosphor screen. The shadow mask has a large number of electron beam apertures which are regularly arranged and through which the electron beams pass. Each of the electron beam apertures has a larger opening open to a surface of the shadow mask on a phosphor screen side, a smaller opening open to a surface of the shadow mask on an electron gun side and communicating with the larger opening, and a minimum-diameter portion defined by the boundary between the large and smaller openings. In each of the electron beam apertures located at the peripheral portion of the shadow mask, at least that portion of a wall surface defining the smaller opening which is located outward in a radial direction with respect to a center of the shadow mask has a bulging portion which bulges outward in the radial direction.

Conventionally, an aperture wall surface defining a smaller opening is etched to be substantially symmetrical with respect to the central axis of the smaller opening. However, with the present invention having the above mentioned construction, in each of the smaller openings located at the peripheral portion of the shadow mask, the angle defined by the central axis of the aperture and that portion of the wall surface defining the smaller opening which is located on the side through which the electron beam travels, larger than the angle defined by the central axis of the aperture and that portion of the wall surface which is located on the central side of the shadow mask. More specifically, in the apertures located on the peripheral portion of the shadow mask, if the inclination of the outward portion of the wall surface defining the smaller opening with respect to the central axis of the aperture is larger than the central side portion of the wall surface, if an electron beam collides against the outward portion of the wall surface of the smaller opening in the radial direction (a side through which the electron beam travels) with respect to the center of the mask, the rate that the electron beam is reflected to the phosphor screen side is decreased.

When the side of the aperture section through which the electron beam travels is considered, a beam spot distortion caused when an electron beam collides against the side wall defining the larger opening can be suppressed. This is done by setting an angle defined by a straight line connecting the end edge of the larger opening on the phosphor screen side and the mating point of the larger and smaller openings, and the central axis of the aperture, to be larger than the angle defined by the axis of the electron beam and the central axis of the aperture.

At this time, if the inclination of the entire wall surface defining the smaller opening on the electron gun side is to be changed, the aperture diameter might undesirably be changed in comparison to the conventional case in which the inclination of the wall surface is not controlled. Since a portion in the vicinity of the mating portion of the larger and smaller openings is a portion that determines the electron beam diameter as the minimum-diameter portion, the inclination of the wall surface of a portion in the vicinity of the minimum-diameter portion may not be changed, the inclination of a portion other than the minimum-diameter portion may be adjusted instead. In this case, it suffices if the angle defined by the wall surface of the intermediate portion in the direction of thickness of the smaller opening on the peripheral portion of the shadow mask, and the central axis of the aperture, is larger than the angle defined by the wall surface in the vicinity of the minimum-diameter portion and the central axis of the aperture.

According the present invention, a method of manufacturing a shadow mask comprises the steps of: forming a resist film having a printing pattern on a surface of a mask material, the printing pattern having a first pattern including a large number of dot patterns provided to correspond to positions where smaller openings are to be formed, and a second pattern including an independent subpattern provided, with a predetermined gap, on the outside of each of the dot patterns which are located on a peripheral portion of the mask material; and etching the mask material through the resist film to form a large number of smaller openings corresponding to the first pattern and bulging portions which bulge from corresponding smaller openings corresponding to the second pattern.

The first pattern is mainly used for forming that portion of the wall surface defining the smaller opening which is located on the central side of the mask and the minimum-diameter portion of the smaller opening, and the second pattern is used for adjusting inclination of that portion of the wall surface defining the smaller opening which is located on the peripheral side of the mask. A wall surface having a predetermined inclination can be obtained by selecting the gap between the first and second patterns and the size of the second pattern.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 1 to 4 show a color cathode ray tube according to a first embodiment of the present invention, in which:

FIG. 1 is a sectional view of the cathode ray tube,

FIG. 2 is a front view of the cathode ray tube,

FIG. 3 is an enlarged plan view schematically showing the central and peripheral portions of a shadow mask, and FIG. 4 is a sectional view taken along line IV—IV in FIG. 3;

FIGS. 5 to 7 show a modification in which electron beam apertures are rectangular, in which:

FIG. 5 is a plan view showing part of the shadow mask,

FIG. 6 is a sectional view taken along line VI—VI in FIG. 5, and

FIG. 7 is a sectional view taken along line VII—VII in FIG. 5;

FIGS. 8 to 12H show the shadow mask of a color cathode ray tube according to a second embodiment of the present invention and a method of manufacturing the same, in which:

FIG. 8 is a sectional view showing part of the shadow mask,

FIG. 9 is a plan view showing part of the shadow mask,

FIGS. 12A to 12H are sectional views respectively showing etching processes of the shadow mask described above;

DETAILED DESCRIPTION OF THE PREFERRED EMBODIMENTS

Preferred embodiments of the present invention will now be described in detail with reference to the accompanying drawings.

Figure 1:
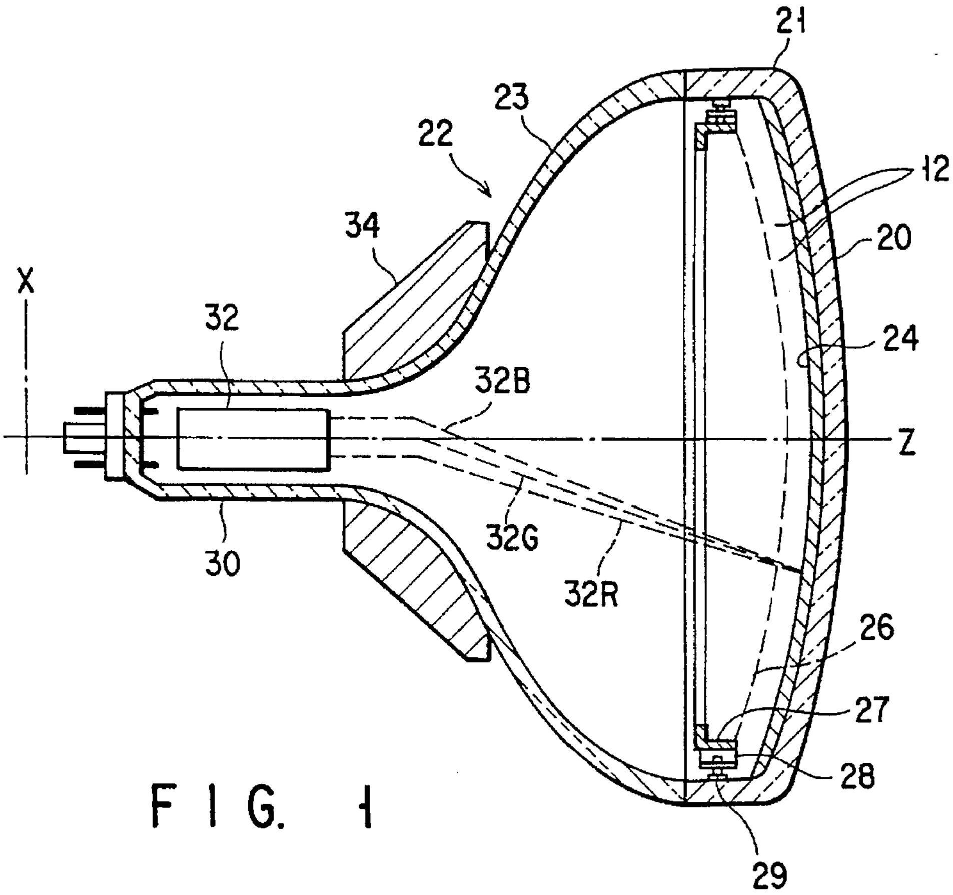

As shown in FIG. 1, a color cathode ray tube according to a first embodiment of the present invention has a glass envelope 22. The envelope 22 is constituted by a substantially rectangular faceplate 20, a skirt portion 21 continuous to the faceplate 20, and a funnel 23 integrally bonded to the skirt portion 21. A phosphor screen 24, on which phosphors that emit light in red, blue, and green are regularly arranged, is formed on the inner surface of the faceplate 20. An electron gun 32 for emitting three electron beams 32R, 32G, and 32B corresponding to red, green, and blue is disposed in a neck 30 of the funnel 23. The electron gun 32 is arranged on a tube axis Z of the cathode ray tube.

Figure 2:
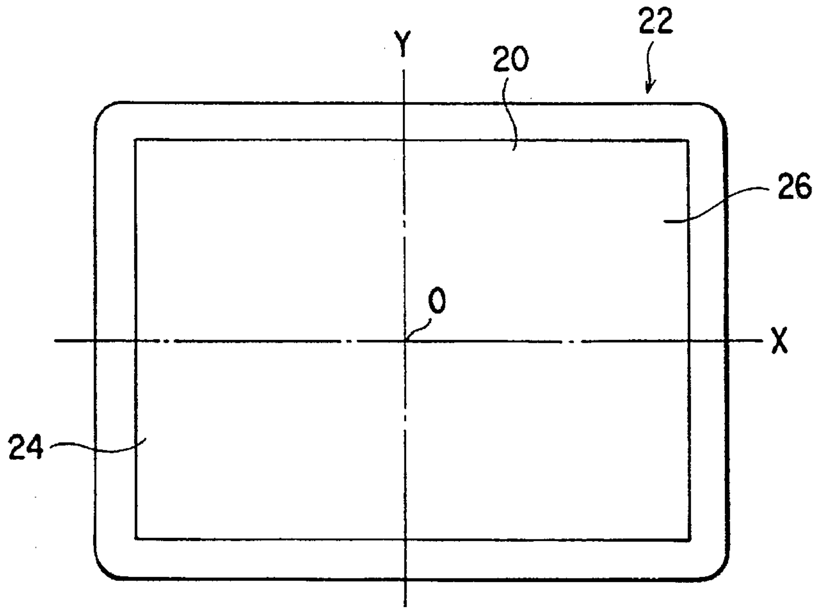

A substantially rectangular shadow mask 26 having a large number of regularly arranged electron beam apertures 12 is disposed at a position in the envelope 22 to closely oppose the phosphor screen 24 at a predetermined distance. The peripheral edge portion of the shadow mask 26 is bonded to a mask frame 27, and a mask holder 28 provided on the mask frame 27 is fitted on stud pins 29 which are fixed to the skirt portion 21, so that the shadow mask 26 is installed inside the faceplate 20. As shown in FIG. 2, the shadow mask 26 has a rectangular shape when seen from the front, and has a center O through which the tube axis Z extends, and a vertical axis Y and a horizontal axis X both extending through the center.

The three electron beams 32R, 32G, and 32B emitted from the electron gun 32 are deflected by a magnetic field generated by a deflection yoke 34 which is mounted on the outer surface of the funnel 23. The deflected electron beams are subjected to selection by the shadow mask 26 and scan the phosphor screen 24 in the horizontal and vertical directions, thereby displaying a color image on the faceplate 20.

Figure 3:
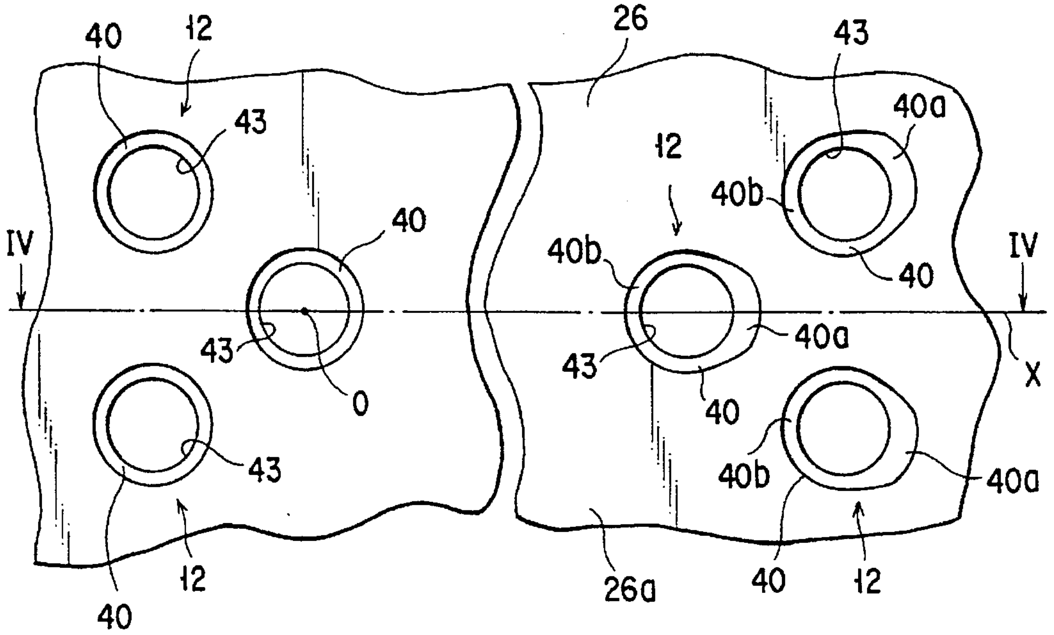
Figure 4:
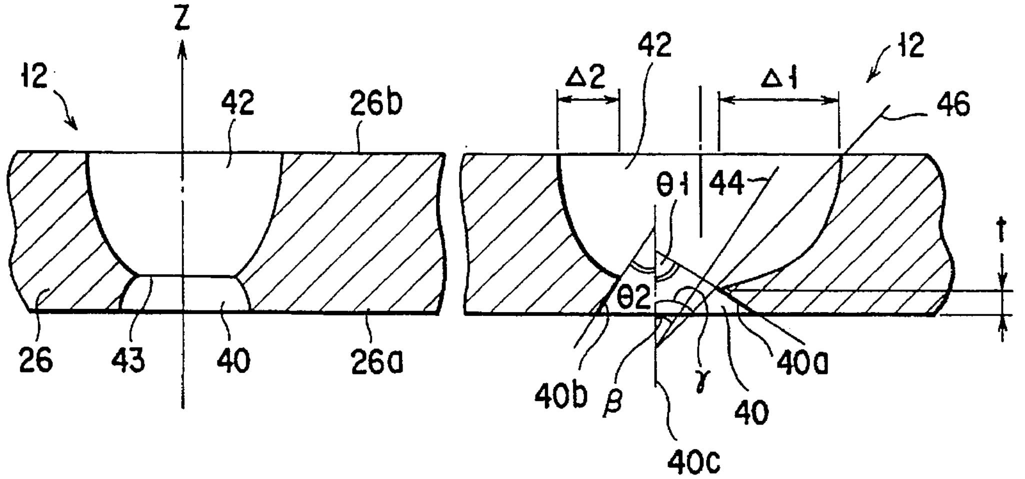

As shown in FIGS. 3 and 4, the shadow mask 26 is formed of a thin metal plate having a thickness of 0.13 mm. The circular electron beam apertures 12 are regularly formed in the metal thin plate at an opening pitch of 0.3 mm. Each electron beam aperture 12 has a graded side opening 40 (hereinafter called a smaller opening 40) open to a surface 26*a* of the shadow mask 26 on side of the electron gun 32, and a cone side opening 42 (hereinafter called a larger opening 42) open to a surface 26*b* of the shadow mask 26 on the side of the phosphor screen 24 and communicating with the smaller opening 40. The smaller opening 40 is constituted by a substantially arcuated recess having an opening diameter of 0.14 mm. Similarly, the larger opening 42 is constituted by a substantially arcuated recess having an opening diameter of 0.28 mm. The small and larger openings 40 and 42 communicate with each other at the bottom portions of these recesses. The minimum-diameter portion of the electron beam aperture that determines the aperture diameter of the electron beam aperture 12 is defined by a boundary 43 between the smaller and larger openings 40 and 42.

As can be seen well from FIG. 4, in the central portion of the shadow mask 26, since an electron beam emitted from the electron gun 32 is incident on the surface of the shadow mask 26 almost vertically, the smaller and larger openings 40 and 42 of each electron beam aperture 12 are formed coaxially with each other. In contrast to this, in the peripheral portion of the shadow mask 26, an electron beam is obliquely incident on the surface of the shadow mask 26 and on the corresponding electron beam aperture 12. Therefore, in the peripheral portion of the shadow mask 26, the larger openings 42 of the electron beam apertures 12 are shifted from the corresponding smaller openings 40 outward in the radial direction with respect to the center O of the shadow mask 26.

More specifically, in each electron beam aperture 12, assume that the distance between the boundary 43 and the opening edge of the larger opening 42 in the horizontal direction are indicated by Δ1 with respect to a direction extending from a reference line 40*c* (which is a line extending perpendicular to the surface 26*a* of the shadow mask 26 through the smaller opening and will be hereinafter called a central axis 40*c*) of the smaller opening 40 toward the side opposite to the center O of the shadow mask 26, and Δ2 with respect to a direction extending from the central axis 40*c* toward the center O of the shadow mask 26. Then, Δ1 and Δ2 are equal in electron beam apertures in the vicinity of the center of the shadow mask 26. The closer an electron beam aperture 12 is to the peripheral portion of the shadow mask 26, the larger the distance Δ1 of the electron beam aperture 12 is than the distance Δ2.

The inclination of the wall surface defining the smaller opening 40 of each electron beam aperture 12 is as follows. The wall surface defining the smaller opening 40 is formed such that a straight line extending through the open edge of the smaller opening 40 and the boundary 43 intersects the central axis 40*c* of the smaller opening on the phosphor screen 24 side with respect to the mask surface 26*a*. In other words, the wall surface of the smaller opening 40 is tapered from the open edge of the smaller opening toward the boundary 43.

Regarding electron beam apertures 12 located at the peripheral portion of the shadow mask 26, the wall surface of the shadow mask which defines the smaller opening 40 includes an outward portion 40*a* which is located outward (right side of the central axis 40*c* in FIG. 4) in a radial direction with respect to the center O of the shadow mask, and a central-side portion 40*b* which is located on a central side (left side of the central axis 40*c* in FIG. 4) of the shadow mask. The angle θ1 defined by the central axis 40*c* of the smaller opening 40 and the outward portion 40*a* of the wall surface is larger than the angle θ2 defined by the central axis 40*c* and the central-side portion 40*b* of the wall surface.

In conventional shadow masks, the inclination of the wall surface defining the smaller opening is substantially symmetrical with respect to the central axis 40*c* of the smaller opening 40. When an electron beam collides against the outside portion 40*a* of the wall surface, in the direction of radiation, of the smaller opening 40, the reflected electron beam is directed to the phosphor screen at a high rate. In contrast, in this embodiment, since the outward portion 40*a* of the smaller opening wall surface is formed having a larger inclination than the central-side portion 40*b* with respect to the central axis 40*c* of the smaller opening 40 collection beams colliding against the outward portion 40A are reflected by the outward portion to the election gun side. Thus, the rate of electron beams reflected by the outward portions 40*a* toward the phosphor screen can be decreased. As a result, unnecessary illumination of a phosphor caused by the reflected electron beams can be prevented, thereby improving the contrast.

When the inclination of the entire wall surface of the smaller opening 40 open to the electron gun side is to be made moderate, the diameter of the electron beam aperture itself may undesirably be changed. If the aperture diameter is maintained at a predetermined level, the angle defined by the outward portion 40*a* of the smaller opening wall surface, and the central axis of the smaller opening cannot be increased, and the reflected electron beams are directed to the phosphor screen. In contrast to this, according embodiment, since the inclination of the smaller opening wall surface is partially changed, an influence on the diameter of the electron beam aperture is small, and the aperture diameter can be maintained at a predetermined value.

According to this embodiment, the larger opening 42 is formed such that γ is larger than β, where β is the angle of incidence of an electron beam 44 on the central axis 40*c* of the smaller opening 40, and γ is the angle defined by a line 46, extending through the boundary 43 and the open edge of the larger opening 42 in a region radially located outside of the central axis 40*c*, and the central axis 40*c*.

For this reason, even at the peripheral portion of the shadow mask 26, an electron beam which is incident on the electron beam aperture 12 and defined by the minimum-diameter portion of the aperture 12, i.e., by the boundary 43, is incident on the phosphor screen 24 without being shielded by the open edge of the larger opening 42. Accordingly, omissions in a beam spot formed on the phosphor screen 24 can be prevented, thereby obtaining beam spots which are defined by the minimum-diameter portion to have a desired shape and free from distortion.

As shown in FIG. 4, the larger a distance t from the open edge of the smaller opening 40 to the boundary 43, the higher the strength of the shadow mask. However, from the viewpoint of formation of an electron beam aperture by etching, in order to increase the distance t, the etching amount of the shadow mask from the smaller opening 40 side must be increased. When the etching amount is increased, the etching amount in the horizontal direction is inevitably increased. Then, the printing pattern size must be decreased by an amount corresponding to an increase in horizontal etching amount, which causes a non-uniformity in the pattern, leading to a degradation in the quality.

In order to increase the etching amount of the smaller opening 40, the amount of etchant supplied to the smaller opening must be increased. Usually, in the etching process, a mask material is conveyed horizontally while the surface of the mask material on the smaller opening side faces upward. Even if the etchant on the mask material and the contact area with the etchant are uniformly maintained by vibrating a spray nozzle, as the amount of etchant is increased, the etchant remains non-uniformly to cause non-uniform etching. Therefore, the distance t is preferably ⅓ or of less the mask thickness from the viewpoint of keeping uniform etching comparatively easy.

Figure 5:
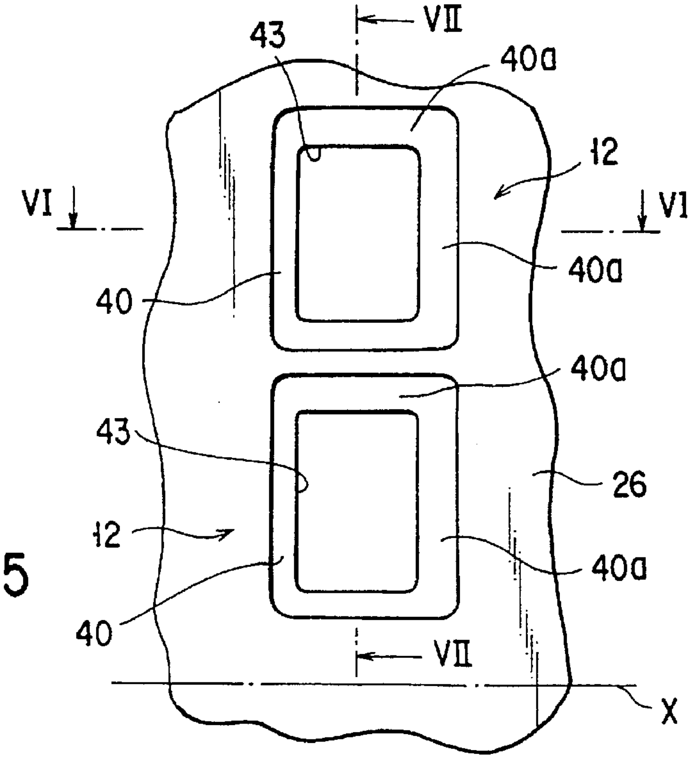
Figure 6:
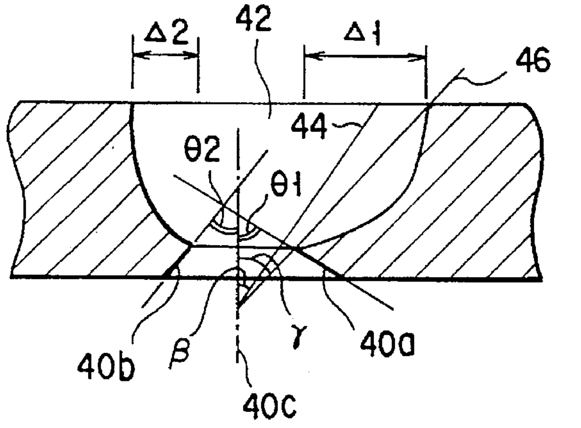
Figure 7:
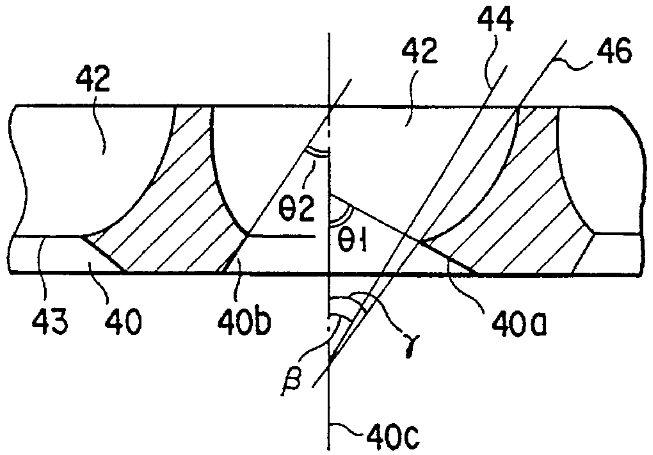

In the above embodiment, the electron beam apertures are circular. However, the above-mentioned arrangement can similarly be applied to a shadow mask having rectangular electron beam apertures as shown in FIGS. 5 to 7. In the case of rectangular electron beam apertures, if respective electron beam apertures 12 located at the peripheral portion of a shadow mask are formed such that an inclination angle θ1 defined by a radially outward portion 40*a* of the wall surface defining each smaller opening 40 and a central axis 40*c* of the smaller opening 40 is larger than an inclination angle θ2 defined by a central-side portion 40*b* of the smaller opening wall surface and the central axis of the smaller opening, the same effect as that in the above embodiment can be obtained. In FIGS. 5 to 7, the same components as in the first embodiment are denoted by the same reference numerals.

In the above-mentioned embodiment, the inclination of the wall surface defining the smaller opening, i.e., the angle defined by a straight line extending through the open edge of the smaller opening 40 and the boundary 43, and the central axis 40*c*, is changed between the regions radially located on the outside and on the central side with respect to the central axis 40*c* of the smaller opening 40. However, the boundary is the portion defining the minimum-diameter portion for determining the electron beam diameter. Thus, in a portion near the minimum-diameter portion, the inclination of the smaller opening wall surface may preferably be set in the same manner as in the conventional case for the following reason. To change the inclination of the wall surface of the smaller opening, the dot diameter of the smaller opening side printing pattern may be changed. In this case, the mating position of the larger and smaller openings is changed, and the aperture diameter will not be stable.

Figure 8:
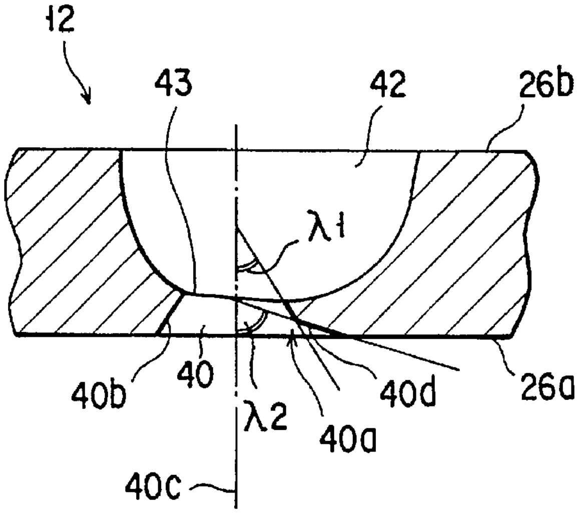
Figure 9:
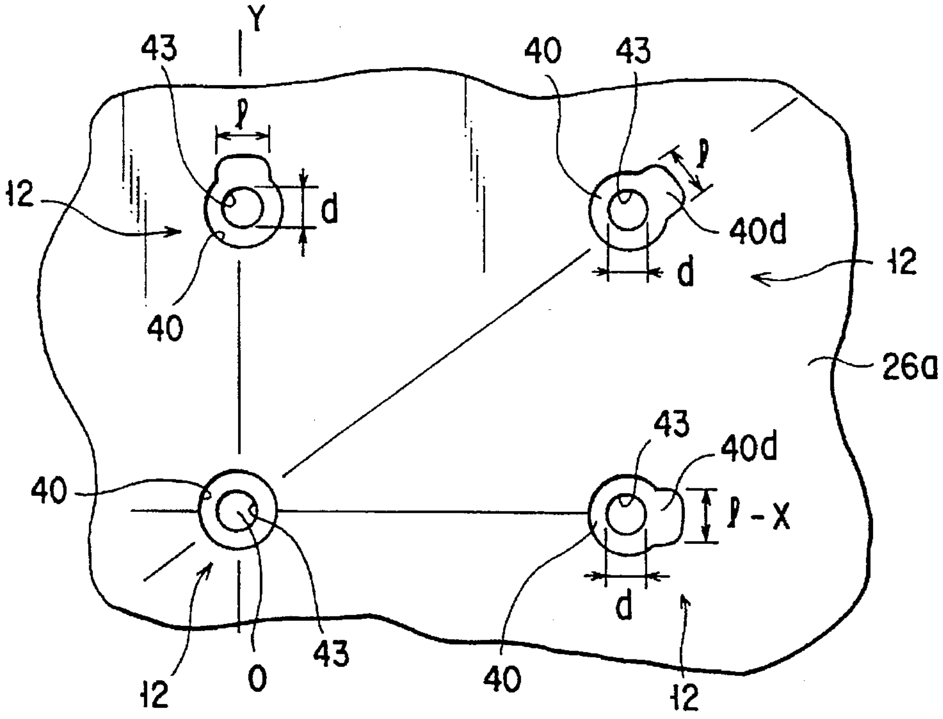

According to a second embodiment of the present invention shown in FIGS. 8 and 9, that portion of the wall surface defining the smaller opening which is close to the minimum-diameter portion for controlling the electron beam is maintained unchanged, and the inclination of that portion of the wall surface which extends from the intermediate portion, located between the minimum-diameter portion and the open edge of the smaller opening, to the open edge of the smaller opening is changed so that a reflected electron beam is prevented from reaching the phosphor screen.

More specifically, as shown in FIG. 8, regarding electron beam apertures 12 arranged at the peripheral portion of a shadow mask 26, when considering a radially outward portion 40*a* of the wall surface defining a smaller opening 40 of each electron beam aperture 12, an angle λ2 defined by a first section 40*d* extending from the intermediate portion, which is located between the open edge of the smaller opening and the minimum-diameter portion 43, to the open edge of the smaller opening and the central axis 40*c* is set larger than an angle λ1 defined by a second section extending from the intermediate portion to the minimum-diameter portion 43 and the central axis 40*c*. As shown in FIG. 9, when the shadow mask is observed from the electron gun side, in the smaller opening 40 of the electron beam aperture 12 located on the peripheral portion of the shadow mask, a portion of the smaller opening wall surface which excludes a portion near a minimum-diameter portion 43 and which is located outward in the radial direction with respect to the shadow mask center O bulges in the radial direction. When the smaller opening 40 is formed in this shape, the minimum-diameter portion 43 serves as a portion that determines the electron beam diameter, and the bulging portion 40*d* controls inclination of the smaller opening wall surface, thereby preventing a reflected electron beam from reaching the phosphor screen.

Therefore, according to the second embodiment, the amount of reflected electron beams reaching the phosphor screen can be decreased without changing the height of the minimum-diameter portion 43 in the direction of the mask thickness of the aperture diameter. The second embodiment can also be applied to a shadow mask having rectangular electron beam apertures.

A method of manufacturing the shadow mask according to the second embodiment will be described with reference to the accompanying drawings by way of an example of forming circular electron beam apertures. The shadow mask of this embodiment can be easily formed by using the etching pattern of the shadow mask. This method will be described in accordance with the flow of processes.

First, a substantially rectangular mask material having a desired thickness is treated by degreasing and washing with an alkaline solution or similar solution, and resist films are formed on the two surfaces of the mask material. Thereafter, desired larger and smaller opening patterns are arranged in tight contact on the two surfaces of the mask material, on which the resist films are formed, and aperture pattern latent images are formed on the resist films by using an ultraviolet radiation light source. Formation of the aperture patterns are performed by using, e.g., a photoplotter available from Gurber Co., Ltd., U.S.A.

The angle of incidence of the electron beam on the shadow mask is larger on the peripheral portion of the mask than on the central portion of the mask because the electron beam is obliquely incident on the peripheral portion. For this reason, depending on the types of the mask, as shown in FIG. 4, in order to maintain a necessary distance Δ1, as closer to the outward portion of the mask, the larger and smaller openings to be mated with each other are sometimes deviated from each other. In some masks, as the aperture pitch is decreased, the larger opening diameter is decreased, and the value Δ1 is decreased accordingly, so that the deviation amount between the larger and smaller openings is large. Also, in some masks, as the mask thickness is increased, the required distance Δ1 is increased, and thus a large deviation is set. In mask aperture patterns used for forming these shadow masks, when the smaller opening pattern is set with respect to the larger opening pattern, or vice versa, when necessary in accordance with the positions of the patterns, the central axes of the larger and smaller openings are deviated from each other. Naturally, in some masks, the larger and smaller openings need not be deviated from each other throughout the mask surface.

In a printing pattern used for forming mask apertures having such a structure, a large number of dot arrays each including a circular dot pattern are arranged in accordance with the aperture shape of the mask to be formed. Separate printing patterns are necessary for the larger and smaller openings, and the shapes of the printing patterns are different between the larger and smaller openings.

Figure 10A:
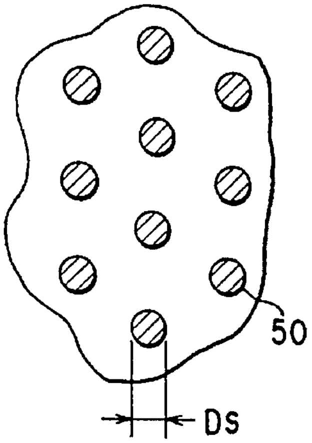
FIG. 10A is a plan view showing a resist film for larger openings.
Figure 10B:
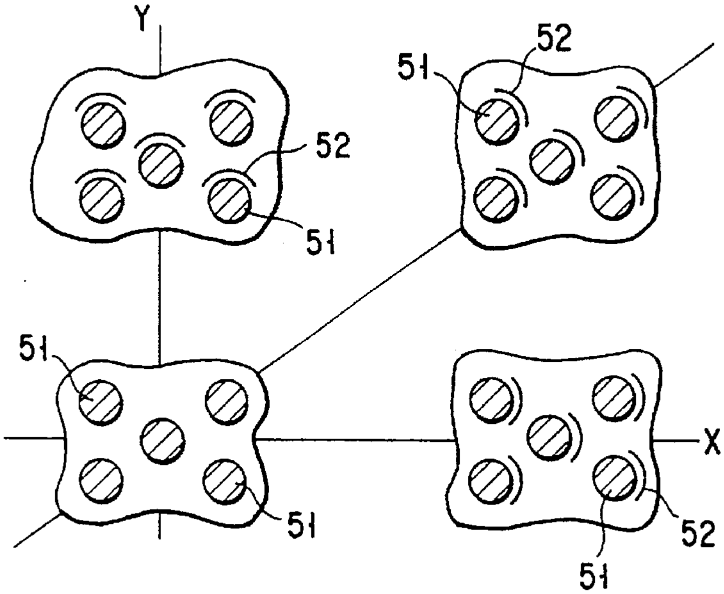
FIG. 10B is a plan view showing a resist film for smaller openings.

FIGS. 10A and 10B respectively show the larger and smaller opening patterns. As shown in FIG. 10A, the larger opening pattern is formed of opaque dot patterns 50, and the diameter of the respective dots are basically the same throughout the surface of the shadow mask. However, if shadow masks have different grades due to etching in spite of the fact that the mask aperture diameters of the mask specifications formed by etching are uniform, or if the mask specification specifies masks having different grades, the dot diameter of the larger opening pattern must also be appropriately changed in accordance with the location on the mask.

FIG. 10B schematically shows the state of the smaller opening pattern located at the central portion and the respective axial end portions of the shadow mask in the first quadrant of FIG. 2. In the peripheral portions, the smaller opening pattern has a first pattern constituted by a large number of opaque circular dot patterns 51 having a diameter smaller than that of the larger openings but having the same shape as that of the larger openings, and a second pattern constituted by a large number of arcuated independent patterns (subpatterns) 52 for forming bulging portions on the side of the dot patterns, from which the electron beam propagates.

The center of each dot of the smaller opening circular dot pattern 51 substantially corresponds to or is offset, if necessary, from the center of each dot of the larger opening dot pattern 50. In a region extending from the center of the shadow mask to an arbitrary position, since the electron beam incident angle to the mask aperture is small and the value of Δ1 necessary for preventing an eclipse of the beam at the aperture end of the smaller opening is small, the smaller openings are formed only of the opaque circular dot patterns 51 having the same shape as that of the larger openings.

The smaller opening pattern used for the peripheral portion of the shadow mask which is apart from the mask center in the direction of the horizontal axis will be described in detail with reference to FIGS. 11A to 11D.

Figure 11A:
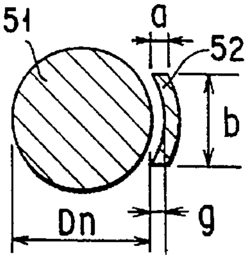
FIG. 11A is an enlarged plan view showing a smaller opening pattern having an arcuated pattern.
Figure 11C:
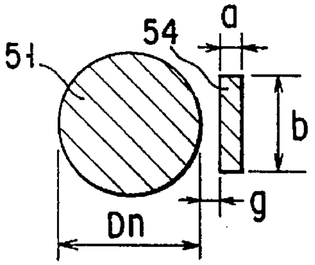
FIG. 11C is an enlarged plan view showing a smaller opening pattern having a linear pattern.

Even if a pattern dot diameter Ds of the larger openings is constant, when a dot diameter Dn of the smaller opening dot pattern 51 is changed, a beam aperture size d (refer to FIG. 9) obtained by etching changes. Accordingly, the dot diameter Dn of the smaller opening pattern is basically uniform throughout the surface of the mask. As shown in FIG. 11A, the arcuated patterns 52 which are arranged independently of the smaller opening dot patterns 51 on the side of the respective dot patterns 51 in which the electron beam travels, (i.e., on the outside of the respective dot patterns 51), are formed in a region remote from the center of the mask by a certain distance. Regarding a width a of the arcuated pattern 52 in the radial direction, a length b of the arcuated pattern 52 in the circumferential direction, and a gap g between the arcuated pattern 52 and the dot pattern 51, in some cases, they are set to be constant throughout the region in the mask in which the arcuated patterns 52 are formed, and in some cases, they are gradually changed depending on the position of the shadow mask. The size of the arcuated pattern 52 may be appropriately set such that it will not influence the minimum-diameter portion of the electron beam aperture and that it can set the wall surface defining the smaller opening to have a predetermined inclination. The second pattern is not limited to an arcuated pattern, but can be a linear pattern 54, as shown in FIG. 11C.

Figure 11B:
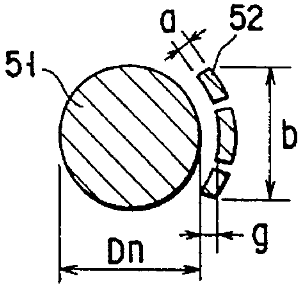
FIG. 11B is an enlarged plan view showing a smaller opening pattern having a divided arcuated pattern.
Figure 11D:
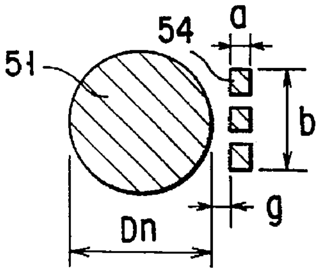
FIG. 11D is an enlarged plan view showing a smaller opening pattern having a divided linear pattern.

In the etching process, the hatched portion in FIG. 11A is etched, and the resist film present between the dot pattern 51 and the arcuated pattern 52 tends to float. Depending on the types of the masks, the resist film at this portion can be easily separated from the mask material by the impact of the sprayed etchant, and the separated resist film in the etchant can make the spray nozzle clog. In this case, as shown in FIGS. 11B and 11D, the arcuated pattern 52 may be constituted by a divided arcuated pattern or by a divided linear pattern, both of which are separated with appropriate gaps. The gap of separation of the divided arcuated or linear pattern must be set within a range not influencing formation of a desired bulging portion.

If the gap g between the dot pattern 51 and the arcuated pattern 52 is excessively small, as side etching progresses in the etching process, the gap g can be joined to a smaller opening dot portion within is a short period of time. Then, not only a necessary bulging portion is not formed, but also the aperture may be deformed. If the gap g is excessively large, the arcuated pattern cannot be easily joined to the smaller opening dot pattern, and an aperture formed with a desired bulging portion cannot be obtained. Therefore, the gap g must be designed by considering the side etching amounts of the smaller opening dot pattern and the arcuated pattern and the etching amount in the direction of depth of the joint portion formed after the smaller opening dot pattern and the arcuated pattern are joined.

The larger the width a of the arcuated pattern 52 in the radial direction, the larger the side etching amount and the etching amount in the direction of depth. More specifically, if the width a is excessively large, the electron beam aperture can be easily deformed in a direction to form a bulging portion. Then, a desired bulging portion cannot be formed.

Since inclination of the smaller opening wall surface of the shadow mask can be adjusted by suppressing the etching amount of the bulging portion in the direction of depth, the width a of the arcuated pattern 52 in the radial direction is preferably small. However, the width actually printed on the resist film depends on the coarseness of the surface of the mask material, the resolution of the resist film, and the thickness of the resist film. Therefore, when casein and bichromate ammonium, which are generally used as the resist material, are used, the width a is preferably selected in a range of 10 to 30 μm.

Formation of the mask printing pattern described above is performed in accordance with automatic drawing by using a photoplotter. First, a high-resolution glass photographic plate is fixed on the plotter by suction with its emulsion surface facing upward. Pattern drawing data recorded as magnetic recording data is transmitted to the plotter through a computer, and light is radiated on the emulsion surface by the plotter in accordance with data, thereby forming a pattern latent image.

After drawing, the steps of development, washing with water, stop, fixing, washing with water, and drying are sequentially performed to form the desired mask printing pattern. In practice, a working pattern used in the shadow mask manufacturing process is not the pattern itself which is drawn by the photoplotter, but a following pattern is used. The drawn pattern is reversed and brought into tight contact with a glass photographic plate to form a reverse image. Defects and the like of this reverse image are corrected, thereby forming a mask pattern. A pattern formed by reversing this mask again and bringing it into tight contact with a glass photographic plate is used as the working pattern. When the mask pattern is prepared, a necessary number of working patterns can be easily formed by reversing and bringing the mask pattern into tight contact with a glass photographic plate by a number of times corresponding to the necessary number of working patterns. The arcuated pattern of the smaller openings may be formed by using drawing means that forms an arc in accordance with linear interpolation.

Hot water of about 40° C. is sprayed on the resist film on which the predetermined pattern is formed in the above manner, thereby dissolving and removing the non-exposed portion of the resist film. Thereafter, etching is performed to expose portions of the mask material where apertures must be formed. When the above development is completed, the resist film is annealed at a temperature of about 200° C. in order to increase its etching resistance. Then, if the mask material contains iron as the major component, a high-temperature solution of ferric chloride is sprayed to the mask to etch the prospective aperture portions of the mask member where the resist film is not present, thereby forming electron beam apertures having desired size and sectional shape. After etching, the resist films are removed, and the mask material is washed and dried, thereby obtaining a desired shadow mask.

In the etching scheme for making the wall surfaces defining the larger and smaller openings and the boundary between the larger and smaller openings, (i.e., the minimum-diameter portion), to have desired shapes, the most significant matter is that after etching progresses from the open ends of the smaller and larger openings so that the larger and smaller openings communicate with each other, the etchant should not be blown through the communicating openings. A method for this will be described with reference to FIGS. 12A to 12H.

Figure 12A:
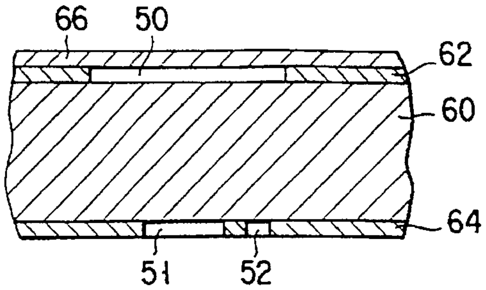
Figure 12B:
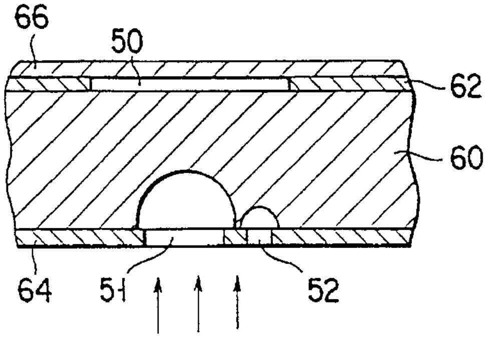
Figure 12C:
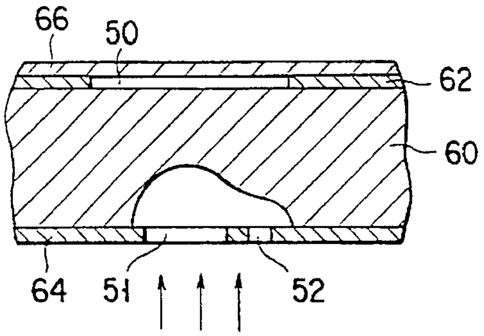

According to a first method, as shown in FIG. 12A, after a resist film 62 for larger openings and a resist film 64 for smaller openings are formed on a mask material 60, the mask material 60 is held such that its larger opening side faces upward and its smaller opening side faces downward. The larger opening side of the mask material 60 is covered with a protection film 66 so that it will not be etched. In this state, the mask material 60 is etched by a necessary amount only from the smaller opening side while it is conveyed horizontally. In this process, the etchant is supplied to the mask material 60 through the smaller opening dot patterns 51 and arcuated patterns 52 around the smaller opening dot patterns 51 which are patterned by the smaller opening resist film 64, and those portions of the mask material 60 which correspond to the smaller opening and arcuated patterns are etched. As shown in FIG. 12B, those portions of the mask material 60 corresponding to the smaller opening patterns and the prospective arcuated patterns are etched in the depthwise and lateral (side etching) directions without joining each other. When etching further progresses, as shown in FIG. 12C, each smaller opening and a corresponding prospective arcuated pattern portion communicate with each other as side etching progresses. By this communication, a smaller opening 40 having a bulging portion **40*d*** extending from the intermediate portion of the wall surface to the open edge is formed.

Figure 12D:
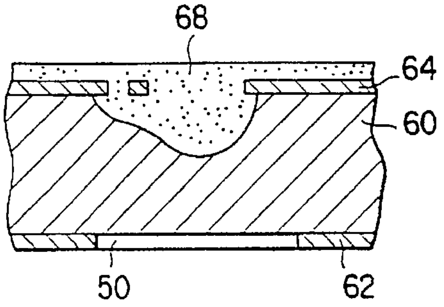
Figure 12E:
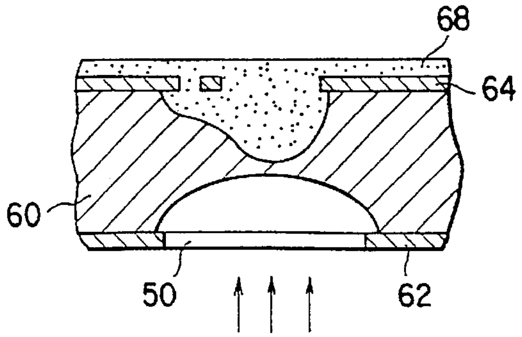
Figure 12F:
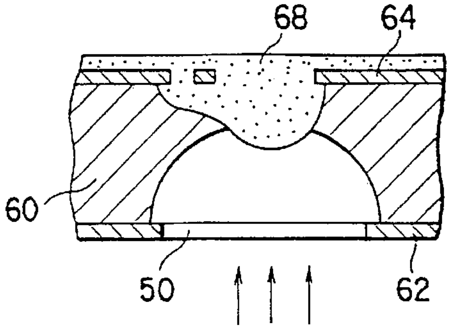
Figure 12G:
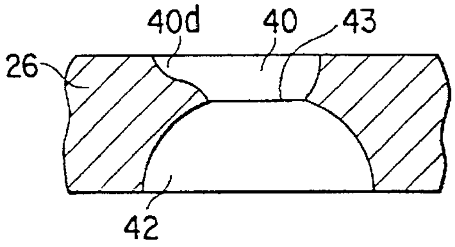

Subsequently, the protection film 66 on the larger opening side is removed from the mask material 60. After the mask material 60 is washed and dried, as shown in FIG. 12D, an anti-etching material 68 is filled in each smaller opening 40 and dried. Thereafter, etching is performed only from the larger opening side until a desired electron beam aperture shape can be obtained. In this case, even if the larger opening communicates with the corresponding smaller opening by etching the larger opening, since the anti-etching material 68 is filled in the smaller opening 40, the etchant will not flow through the aperture portion, as shown in FIG. 12F. After the larger and smaller openings are mated, the larger openings are enlarged, while the smaller openings 40 maintain the desired shape and a size. As a result, the formed aperture has a desired sectional shape. Thereafter, as shown in FIG. 12G, the resist films 62 and 64, and the anti-etching material 68 are removed, and the mask material 60 is washed and dried, thus completing etching of the electron beam apertures.

Figure 12H:
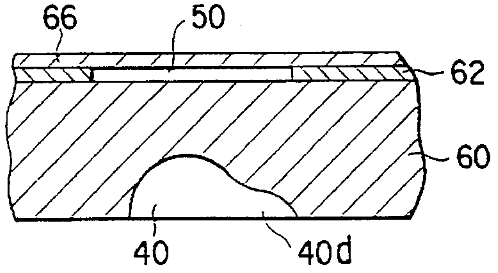

As etching progresses, side etching occurs, and an overhang portion can be formed in that portion of the resist film which is located at the aperture end by side etching. This overhang portion can undesirably interfere with the anti-etching material 68 from being filled in the smaller opening 40. For this reason, the side etching amount and the etching time of the smaller openings are preferably small and short. If a desired smaller opening sectional shape cannot be obtained unless the etching time of the smaller opening 40 is prolonged, as shown in FIG. 12H, the resist film 64 on the smaller opening side may be removed by spraying a releasing liquid with the protection film 66 of the larger opening 42 side being adhered, and the anti-etching material 68 may be filled in the smaller opening 40 between the processes shown in FIGS. 12C and 12D. In this case, if the resist film 64 is removed from the mask material between the processes shown in FIGS. 12D and 12F, the etching process can be performed in the same manner as the first method.

A variation in the aperture size is small if an opening having a size close to the size of the resist pattern aperture is formed. Thus, it is suitable to use a spray nozzle that can spray the etchant with a large impact on the mask material.

According to a second method, the two surfaces of the mask material are simultaneously etched for a predetermined period of time while the mask material, which is held such that its smaller opening side faces upward and its larger opening side faces downward, is conveyed horizontally. By this etching, smaller opening portions with a desired shape are formed. In order to decrease the side etching amount, in the same manner as in the first method, a spray nozzle that can spray the etchant with a large impact is suitable. After the mask material is washed and dried, an anti-etching material is filled in the etched portions of the smaller openings. Thereafter, the larger openings are etched in the same manner as in the first method, thereby obtaining a target aperture sectional shape.

The etching scheme described above is so-called two-step etching. The size of the smaller opening that substantially determines the size of the electron beam aperture is determined and fixed in first-step etching. Thus, a variation in aperture size is very small when compared to a scheme wherein an etchant is blown through the communicating portion after the larger and smaller openings communicate with each other as well. This scheme is thus suitable for the manufacture of a high-definition shadow mask.

Figure 13:
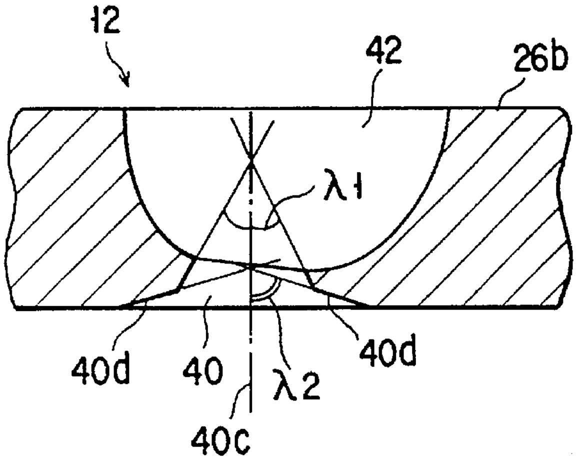
FIG. 13 is a sectional view showing part of the shadow mask of a color cathode ray tube according to a third embodiment of the present invention.

In the second embodiment described above, a bulging portion is provided at that portion of the wall surface defining the smaller opening which is radially located on the outside of the center axis of the smaller opening with respect to the center of the shadow mask. However, a bulging portion may be provided at the entire circumferential portion of the smaller opening, as shown in FIG. 13. More specifically, at the peripheral portion of a shadow mask 26, in the entire circumferential portion of the wall surface defining a smaller opening 40 of an electron beam aperture 12, an angle λ2 defined by a wall surface portion 40*d*, extending from the intermediate portion, located between the minimun-diameter portion 43 and the open edge of the smaller opening, to the open edge of the smaller opening, and a central axis 40*c*, is larger than an angle λ1 defined by the wall surface portion in the vicinity of a minimum-diameter portion 43 and the central axis 40*c*. Also in this arrangement, the minimum-diameter portion 43 serves as a portion for determining the electron beam diameter, and a bulging portion 40*d* controls inclination of the smaller opening wall surface, thereby preventing the reflected electron beams from reaching the phosphor screen.

Figure 14A:
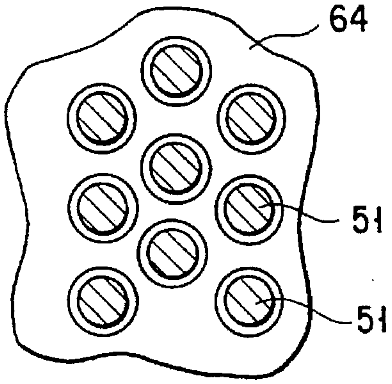
FIG. 14A is a plan view of a resist film for smaller openings of the shadow mask in the third embodiment.
Figure 14B:
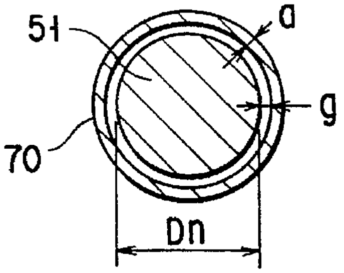
FIG. 14B is an enlarged plan view of the smaller opening pattern.

When the smaller opening having the above arrangement is formed by etching, as shown in FIGS. 14A and 14B, each smaller opening pattern formed in a resist film 64 has a first pattern constituted by a large number of circular dot pattern 51 and a second pattern constituted by a large number of annular patterns 70 formed around the corresponding circular dot patterns to be coaxial with them. A width a of the annular pattern 70, and a gap g between the annular pattern 70 and the circular dot pattern 51 are set in the same manner as in the second embodiment. When a resist film having this arrangement and the etching scheme described above are used, an electron beam aperture shown in FIG. 13 is formed, thus providing the same effect as that of the second embodiment.

Figure 14C:
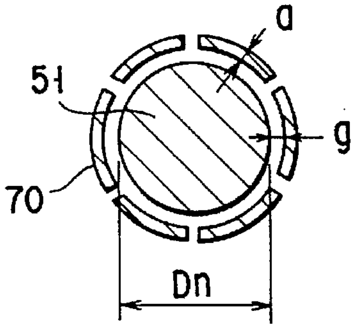
FIG. 14C is a plan view showing a modification of the smaller opening pattern.

The annular pattern 70 may be divided into a predetermined number, as shown in FIG. 14C. Further, the above-mentioned second embodiment can be applied to a shadow mask having rectangular electron beam apertures.

As has been described above, according to the present invention, an electron beam incident on the electron beam aperture of the shadow mask will not cause beam cutouts by collision against the wall surface defining the aperture. Even if a reflected electron beam is generated in the aperture, it will not land on the phosphor screen. Therefore, a color cathode ray tube using this shadow mask can provide a high-quality screen which displays a black image clearly and which has excellent white uniformity. Since a variation in size of the electron beam apertures of the shadow mask is very small, a color cathode ray tube having a high-quality phosphor screen with a less non-uniformity can be provided.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method of manufacturing a shadow mask having a large number of electron beam apertures, each of the electron beam apertures having a smaller opening open to a first surface of the shadow mask and a larger opening open to a second surface of the shadow mask, the larger opening having an open area larger than an open area of the smaller opening, the method comprising the steps of:

forming a first resist film having a printing pattern on a first surface of a mask material, the printing pattern having a first pattern including a large number of dot patterns corresponding to positions where smaller openings are to be formed, and a second pattern including an independent subpattern provided, with a predetermined gap, around each of the dot patterns which are located at a peripheral portion of the mask material; and etching the mask material through the first resist film to form a large number of smaller openings corresponding to the first pattern and bulging portions which corresponds to the second pattern and which bulge from the corresponding smaller openings.

2. A method according to claim 1, which further comprises the steps of:

forming, on a second surface of the mask material, a second resist film having a large number of dot patterns corresponding to positions where the larger openings are to be formed;

filling an anti-etching material in the smaller openings and the bulging portions formed by the etching step; and etching the mask material through the second resist film to form larger openings corresponding to the dot patterns.

3. A method according to claim 2, wherein the filling step includes removing the resist film and filling the anti-etching material after the resist film is removed.

4. A method according to claim 1, wherein each of the dot patterns of the first pattern have a circular shape, and each of the subpatterns has an arcuated shape extending along a circumference of a corresponding dot pattern.

5. A method according to claim 4, wherein each of the arcuated subpatterns is divided into a plurality of portions along the extending direction.

6. A method of manufacturing a shadow mask having multiple electron beam apertures, each of the electron beam apertures having a smaller opening open to a first surface of the shadow mask and a larger opening open to a second surface of the shadow mask, the larger opening having an open area larger than an open area of the smaller opening, the method comprising the step of:

forming a first resist film having a printing pattern on a first surface of a mask material, the printing pattern having a first pattern including dot patterns corresponding to positions where smaller openings are to be formed, and a second pattern including an independent subpattern provided with a predetermined gap around the dot patterns; and etching the mask material through the first resist film to form smaller openings corresponding to the first pattern and bulging portions corresponding to the second pattern.

7. A method of manufacturing a shadow mask according to claim 6, wherein the first pattern includes a large number of dot patterns.

8. A method of manufacturing a shadow mask according to claim 6, wherein a large number of smaller openings are formed during the etching step using the printing pattern.

9. A method of manufacturing a shadow mask according to claim 6, wherein the second pattern is formed around each of the dot patterns located at a peripheral portion of the mask material.

10. A method according to claim 6, which further comprises the steps of:

forming, on a second surface of the mask material, a second resist film having a large number of dot patterns corresponding to positions where the larger openings are to be formed;

filling an anti-etching material in the smaller openings and the bulging portions formed by the etching step; and etching the mask material through the second resist film to form larger openings corresponding to the dot patterns.

11. A method according to claim 10, wherein the filling steps includes removing the resist film and filling the anti-etching material after the resist film is removed.

12. A method according to claim 6, wherein each of the dot patterns of the first pattern have a circular shape, and each of the subpatterns has an arcuated shape extending along a circumference of a corresponding dot pattern.

13. A method according to claim 12, wherein each of the arcuated subpatterns is divided into a plurality of portions along the extending direction.

14. A method of manufacturing a shadow mask, the method comprising the steps of:

forming a first resist film having a printing pattern on a first surface of a mask material, the printing pattern having a first pattern including dot patterns corresponding to positions where smaller openings are to be formed, and a second pattern including an independent subpattern provided with a predetermined gap around the dot patterns; and etching the mask material through the first resist film to form smaller openings corresponding to the first pattern and bulging portions corresponding to the second pattern.

15. A method of manufacturing a shadow mask according to claim 14, wherein the first pattern includes a large number of dot patterns.

16. A method of manufacturing a shadow mask according to claim 14, wherein a large number of smaller openings are formed during the etching step using the printing pattern.

17. A method of manufacturing a shadow mask according to claim 14, wherein the second pattern is formed around each of the dot patterns located at a peripheral portion of the mask material.

18. A method according to claim 14, which further comprises the steps of:

forming, on a second surface of the mask material, a second resist film having a large number of dot patterns corresponding to positions where the larger openings are to be formed;

filling an anti-etching material in the smaller openings and the bulging portions formed by the etching step; and etching the mask material through the second resist film to form larger openings corresponding to the dot patterns.

19. A method according to claim 18, wherein the filling steps includes removing the resist film and filling the anti-etching material after the resist film is removed.

20. A method according to claim 14, wherein each of the dot patterns of the first pattern have a circular shape, and each of the subpatterns has an arcuated shape extending along a circumference of a corresponding dot pattern.

21. A method according to claim 20, wherein each of the arcuated subpatterns is divided into a plurality of portions along the extending direction.

* * * * *